United States Patent
Chen et al.

(10) Patent No.: US 11,129,296 B2
(45) Date of Patent: Sep. 21, 2021

(54) STAGGERED ARRANGEMENT FOR SERVER FAN ARRAY

(71) Applicant: Quanta Computer Inc., Taoyuan (TW)

(72) Inventors: Chao-Jung Chen, Taoyuan (TW); Yu-Nien Huang, Taoyuan (TW); Tsung-Ta Li, Taoyuan (TW); Kuo-Wei Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/743,958

(22) Filed: Jan. 15, 2020

(65) Prior Publication Data

US 2021/0092868 A1   Mar. 25, 2021

Related U.S. Application Data

(60) Provisional application No. 62/903,235, filed on Sep. 20, 2019.

(51) Int. Cl.
*H05K 7/20* (2006.01)
*G06F 1/20* (2006.01)

(52) U.S. Cl.
CPC .......... *H05K 7/20172* (2013.01); *G06F 1/20* (2013.01); *H05K 7/20727* (2013.01)

(58) Field of Classification Search
CPC .......... H05K 7/20172; H05K 7/20727; H05K 7/20563; H05K 7/20145; G06F 1/20; F04D 29/601; F04D 25/166; F04D 19/002
USPC .................... 361/679.48, 679.49, 679.5, 695
See application file for complete search history.

(56) References Cited

U.S. PATENT DOCUMENTS

| | | | | |
|---|---|---|---|---|
| 6,108,203 A * | 8/2000 | Dittus | ................. | G06F 1/20 165/122 |
| 7,675,747 B1 * | 3/2010 | Ong | ................. | F04D 19/024 361/679.48 |
| 8,734,086 B2 * | 5/2014 | Hopkins | ................. | F24F 7/065 415/61 |
| 2002/0054479 A1 * | 5/2002 | Wu | ................. | H05K 7/20727 361/695 |
| 2010/0142143 A1 * | 6/2010 | Ong | ................. | G06F 1/20 361/679.48 |
| 2013/0115078 A1 * | 5/2013 | Fu | ................. | G06F 1/183 415/213.1 |
| 2017/0027085 A1 * | 1/2017 | Held | ................. | H05K 7/20727 |
| 2017/0086332 A1 * | 3/2017 | Jaskela | ................. | H05K 7/1487 |
| 2017/0215300 A1 * | 7/2017 | Salmond | ................. | F04D 29/601 |
| 2017/0241440 A1 * | 8/2017 | Barron | ................. | F04D 29/703 |

* cited by examiner

*Primary Examiner* — Stephen S Sul
(74) *Attorney, Agent, or Firm* — Nixon Peabody LLP (57) ABSTRACT

A fan arrangement to generate increased airflow in a chassis is disclosed. The chassis includes one area having electronic components. A first row of fan modules is located in the chassis relative to the electronic components to generate airflow in a direction of the length of the chassis through the electronic components. The first row of fan modules includes at least one gap between the fan modules. A second row of fan modules is located a predetermined distance from the first row. The second row of fan modules includes at least one gap between the fan modules. Each of the fan modules in the second row is staggered from one of the fan modules of the first row. A first panel connects one of fan modules in the first row with one of the fan modules of the second row to create a channel.

15 Claims, 4 Drawing Sheets

STAGGERED ARRANGEMENT FOR SERVER FAN ARRAY

PRIORITY CLAIM

The present disclosure claims priority to U.S. Provisional Application Ser. No. 62/903,235, filed Sep. 20, 2019. The contents of that application in its entirety are hereby incorporated by reference.

TECHNICAL FIELD

The present disclosure relates generally to cooling systems for a computing device. More particularly, aspects of this disclosure relate to a staggered fan array arrangement that provides increased airflow.

BACKGROUND

Electronic devices, such as servers, include numerous electronic components that are powered by a common power supply. Servers generate an enormous amount of heat due to the operation of internal electronic components such as controllers, processors, and memory. Overheating from the inefficient removal of such heat has the potential to shut down or impede the operation of such devices. Thus, servers are designed to rely on airflow through the interior of the device to carry away heat generated from electronic components. Servers often include various heat sinks that are attached to the electronic components, such as processing units. Heat sinks are typically composed of thermally conductive material. Heat sinks absorb the heat from the electronic components, thus transferring the heat away from the components. The heat from heat sinks must be vented away from the server. Airflow to vent away such heat is often generated by a fan system. The generated airflow thus carries collected heat away from the components and the heat sink. Thus, airflow can pass through hot electric components in the device without any reverse airflow because the internal layout effectively channels the airflow.

A typical fan system will include multiple fans in a fan array. One technique of modulating fan power is using a pulse width modulation control signal. Pulse width modulation turns the power supply to fan-on and fan-off at a fixed frequency. Duty-cycle adjustments may be made to control the speed of the fan. The larger the duty cycle, the faster the fan spins. A proper frequency must be selected since the fan speed will noticeably oscillate within a pulse-width modulation (PWM) cycle if the signal frequency is too slow.

Figure 1A:
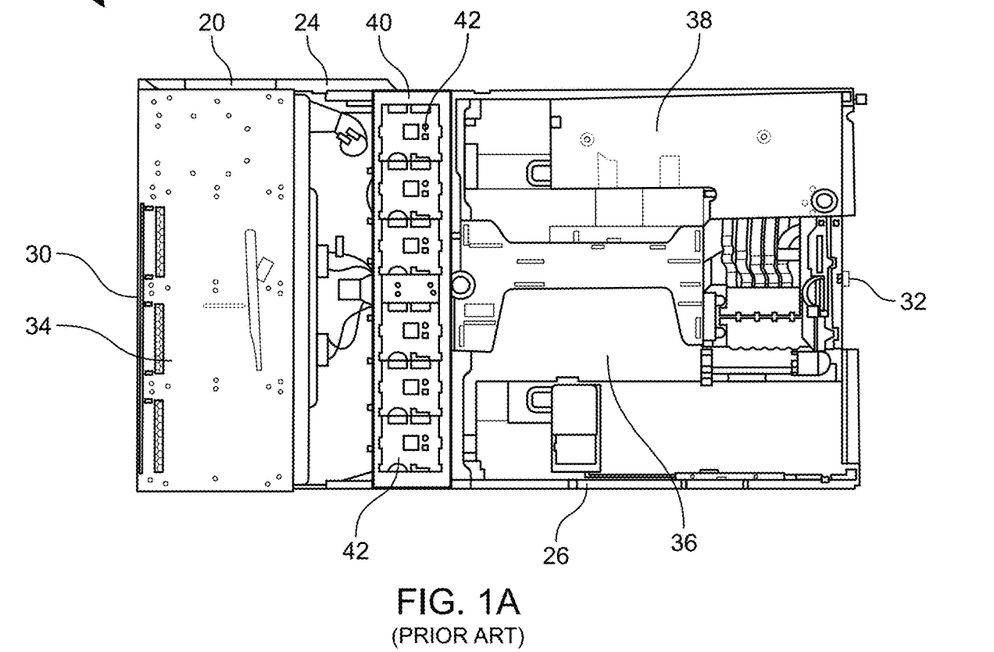
FIG. 1A is a top view of a prior art server showing an array of fans arranged across the chassis of the server.
Figure 1B:
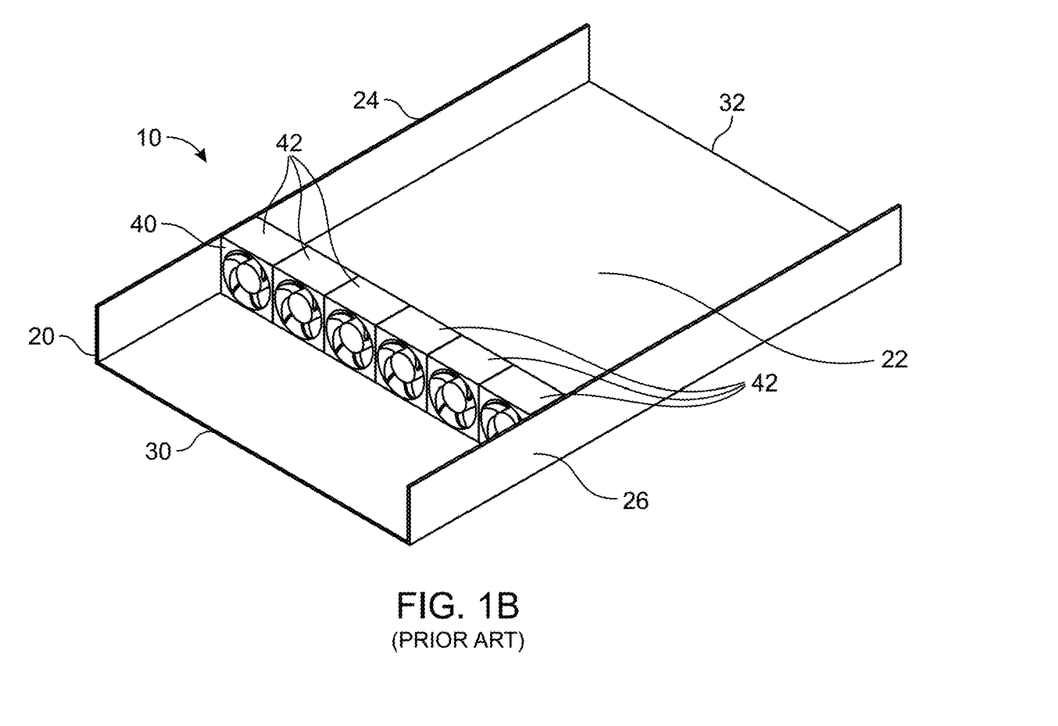
FIG. 1B is a perspective view of the prior art server chassis in FIG. 1A showing the specific layout of the fans in a series arrangement.

In general, server designs, such as a prior art server 10 shown in FIGS. 1A-1B, the fan placement is usually in front of electronic components, which are the main heat source of the server 10. FIG. 1A is a top view of the prior art server 10, and FIG. 1B is a perspective view of a chassis 20 of the server 10. As may be seen in FIGS. 1A-1B, the chassis 20 includes a bottom panel 22 (in FIG. 1B) and two side walls 24 and 26. The chassis 20 has a front end 30 and a rear end 32. Different electronic components are mounted on the bottom panel 22. For example, a power supply unit 34 is mounted near the front end 30. A processor board 36 and a memory device 38 are mounted near the rear end 32.

A fan array 40 is arranged between the front end 30 and the rear end 32. The fan array 40 in this example has six fans 42 arranged in a straight line across the server 10 between the side walls 24 and 26. The fans 42 create airflow between the front end 30 and the rear end 32.

With the rapid developments of electronics technology, the operational speed of components such as processing chips is increasing and correspondingly, power consumption is increasing. The power consumption of such chips generates increasing amounts of heat when in operation. Cooling thus becomes greater in importance to prevent temperatures generated by such chips from exceeding the specified limits. When overheated, such chips may become inoperable, therefore impeding the operation of the server.

One solution to increase cooling is by increasing the airflow to provide more fans, or by increasing the size of the existing fans. However, fan quantity and fan sizes are limited by the dimensions of the server 10. Further, increasing the size of the fans or the quantity of the fans consumes useful areas of the server that may be required for operational components. Another solution is to increase the rotation speed of each of the fans, thus generating more airflow through increased velocity. However, rotation speed is limited by the reliability of the fan components. Currently, fan reliability is reaching its limit, and development has progressed slowly; but the chip heat density is still growing as more sophisticated chips are being developed.

Thus, there is a need for a cooling system that increases airflow based on arrangement of fans in a fan array. There is another need for a cooling system that increases system airflow without having to significantly increase the size or speed of existing fans. There is another need for a cooling system that organizes fans in different zones to increase system airflow.

SUMMARY

One disclosed example is a fan arrangement for an electronic device having a chassis with a length and a width. The chassis includes one area having electronic components. The fan arrangement includes a first row of fan modules located in the chassis relative to the electronic components. The first row of fan modules generates airflow in a direction of the length of the chassis through the electronic components. The first row of fan modules includes at least one gap between the fan modules. A second row of fan modules is located a predetermined distance from the first row of fan modules. The second row of fan modules includes at least one gap between the fan modules. Each of the fan modules in the second row of fan modules is staggered from one of the fan modules of the first row of fan modules. A first panel connects one of the fan modules in the first row of fan modules with one of the fan modules in the second row of fan modules to create a channel.

In another implementation of the disclosed example fan arrangement, the fan arrangement includes a second panel connecting another one of the first row of fan modules with another one of the second row of fan modules to further define the channel. In another implementation, at least one of the fan modules of the second row of fan modules is aligned with the at least one gap between the fan modules of the first row. In another implementation, the second panel includes an angled section. In another implementation, two fan modules of the first row of fan modules are located directly next to each other. Two fan modules of the second row of fan modules are located directly next to each other. In another implementation, multiple gaps are located between each of the fan modules in the first row of fan modules, and multiple gaps are located between each of the fan modules in the second row of fan modules. In another implementation, the channel directs air to an inlet of at least one of the fan modules of the second row. In another implementation, the channel directs air from an outlet end of at least one of the fan modules of the first row.

Another disclosed example is a server having a chassis with a pair of side walls and a bottom panel. Electronic components are mounted in the bottom panel of the chassis. A first row of fan modules is located in the chassis relative to the electronic components, in order to generate airflow in a direction of a length of the chassis between the side walls through the electronic components. The first row of fan modules includes at least one gap between the fan modules. A second row of fan modules is located a predetermined distance from the first row of fan modules. The second row of fan modules includes at least one gap between the fan modules. Each of the fan modules in the second row of fan modules is staggered from one of the fan modules of the first row of fan modules. A first panel connects one of the fan modules in the first row of fan modules, with one of the fan modules in the second row of fan modules to create a channel.

In another implementation of the disclosed example server, a second panel connects a fan module in the first row with another fan module in the second row to further define the channel. In another implementation, at least one of the fan modules of the second row of fan modules is aligned with the at least one gap between the fan modules of the first row. In another implementation, the second panel includes an angled section. In another implementation, two fan modules of the first row of fan modules are located directly next to each other. Two fan modules of the second row of fan modules are located directly next to each other. In another implementation, multiple gaps are located between each of the fan modules in the first row of fan modules, and multiple gaps are located between each of the fan modules in the second row of fan modules. In another implementation, the channel directs air to an inlet of at least one of the fan modules of the second row. In another implementation, the channel directs air from an outlet end of at least one of the fan modules of the first row.

Another example is a server including a chassis having a first side wall, a second side wall, and a bottom panel attached to the first and second side wall. Electronic components are mounted in the bottom panel of the chassis. A first row of fan modules is located in the chassis relative to the electronic components. The first row of fan modules has a first group of two fan modules next to each other against the first side wall. The first row also has a second group of two fan modules separated from the first group of fan modules by a first gap. The second group of two fan modules is separated from the second side wall by a second gap. A second row of fan modules is located a predetermined distance from the first row of fan modules. The second row of fan modules includes a first group of two fan modules staggered from the first group of two fan modules of the first row. One of the fan modules, in the first group of fan modules in the second row, is aligned with the first gap of the first row. The second row has a first gap between the first group of two fan modules and the first side wall. The second row has a second group of two fan modules, and a second gap separating the first group of fan modules from the second group of two fan modules. A center panel connects the second group of two fan modules of the first row with the first group of two fan modules of the second row. A first slanted panel connects the first group of two fan modules of the first row with the first group of fan modules of the second row. An outflow channel from the first group of fan modules in the first row is defined between the first slanted panel and the first wall. An inflow channel to the first group of fan modules in the second row is defined between the first slanted panel and the center panel.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly, or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward a fan arrangement that increases airflow to carry away heat generated by a computing device such as a server. The example fan array includes staggered arrangement of individual fan modules in two rows to increase the system airflow. The fan modules in the two rows are staggered from each other to create different fan zones to increase overall airflow. The system airflow from the staggered arrangement increases airflow about 25% more than a straight line fan arrangement, as shown in the server chassis 20 in FIGS. 1A-1B.

Figure 2A:
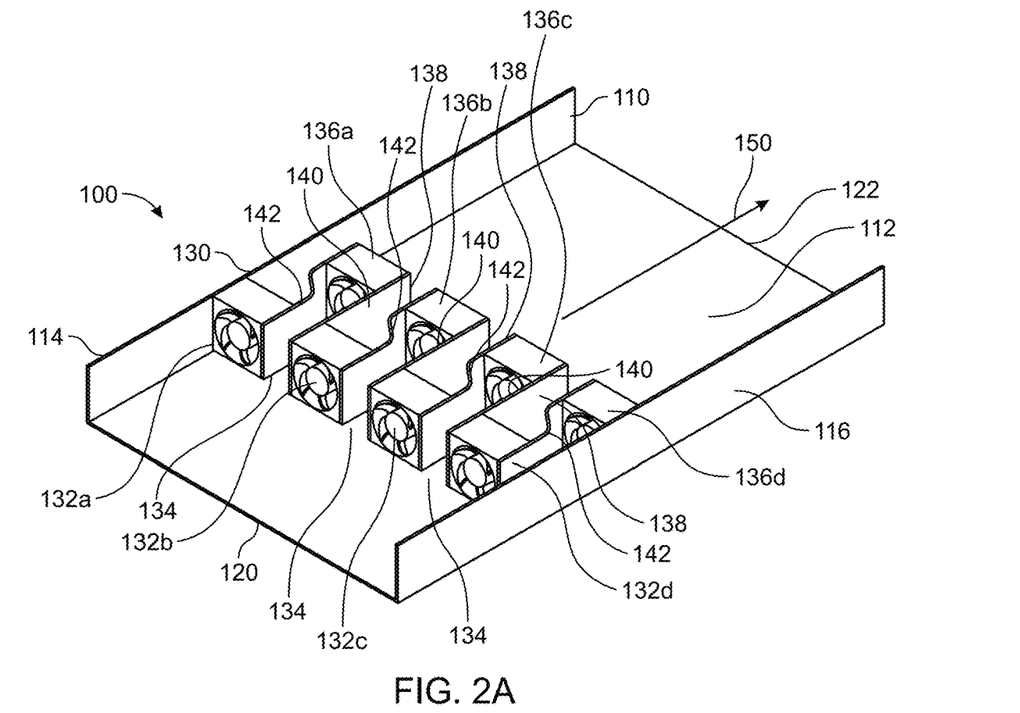
FIG. 2A is a perspective view of an example server chassis with a staggered arrangement of fans.

FIG. 2A is a perspective view of an example server 100 having a chassis 110 with a staggered arrangement of fans. The chassis 110 holds electronic components (not shown) such as power supplies, circuit boards, processors, memory devices, and interface components on different circuit boards such as a mother board. The chassis 110 has an internal area for mounting the electronic components that is defined by the length of the chassis 110 and the width of the chassis 110. The electronic components generate heat, which may be radiated from attached heat sinks.

The chassis 110 includes a bottom panel 112 and two side walls 114 and 116 that define the internal area of the chassis 110. The chassis 110 has a front end 120 and a rear end 122. A fan array 130 is arranged between the front end 120 and the rear end 122. The fan array 130 generates airflow to carry away generated heat from the electronic components in the chassis 110.

The fan array 130 in this example has a first set of four fan modules 132a, 132b, 132c, and 132d that are arranged in a straight row across the chassis 110 between the side walls 114 and 116. The first set of fan modules 132a-132d are arranged so there are gaps 134 between each of the fan modules 132a-132d.

The length across the chassis 110 occupied by the four fan modules 132a-132d and the gaps 134 are the equivalent of the six fan modules 42 arranged side-by-side in FIGS. 1A-1B. The row of fan modules 132a-132d are set a distance from the front end 120. The row of fan modules 132a-132d are generally parallel to the front end 120.

The fan array 130 has a second set of four fan modules 136a, 136b, 136c, and 136d arranged in a straight row across the chassis 110 between the side walls 114 and 116. As may be seen, the second set of fan modules 136a-136d is located rearward of the first set of fan modules 132a-132d in a staggered arrangement. Thus, the second set of fan modules 136a-136d are separated from the first set of fan modules 132a-132d by a specific distance. Each fan module 136a-136d is aligned with the gaps 134 between the first set of fan modules 132a-132d to partially overlap the width of one of fan modules 132a-132d. The second set of fan modules 136a-136d are arranged so there are gaps 138 between each of the fan modules 136a-136d. Each of the fan modules 132a-132d and 136a-136d include a housing that mounts a motor that rotates fan blades to generate airflow between an inlet side and an outlet side. The motor in this example may be controlled by a PWM signal supplied via a controller, such as a fan controller or baseboard management controller.

The length across the chassis 110 occupied by the four fan modules 136a-136d and the gaps 138 are the equivalent of the six fan modules 42 arranged side-by-side in the server chassis 20 shown in FIGS. 1A-1B. Each of the fan modules 132a-132d in the first set of fan modules are aligned with one of the gaps 138 between the second set of fan modules 136a-132d. Each of the fan modules 132a-132d partially overlap the width of one of the second set of fan modules 136a-132d.

A series of straight panels 140, corresponding slanted panels 142, and the side walls 114 and 116, define a first set of channels that direct the airflow to the second set of fan modules 136a-136d. A second set of channels is defined that direct airflow from the first set of fan modules 132a-132d. The fan modules 132a-132d and 136a-136d create airflow between the front end 120 and the rear end 122 of the chassis 110, as shown by an arrow 150. The airflow generated by the respective fan modules 132a-132d and 136a-136d are guided by the channels created by the panels 140 and 142, and side walls 114 and 116.

Figure 2B:
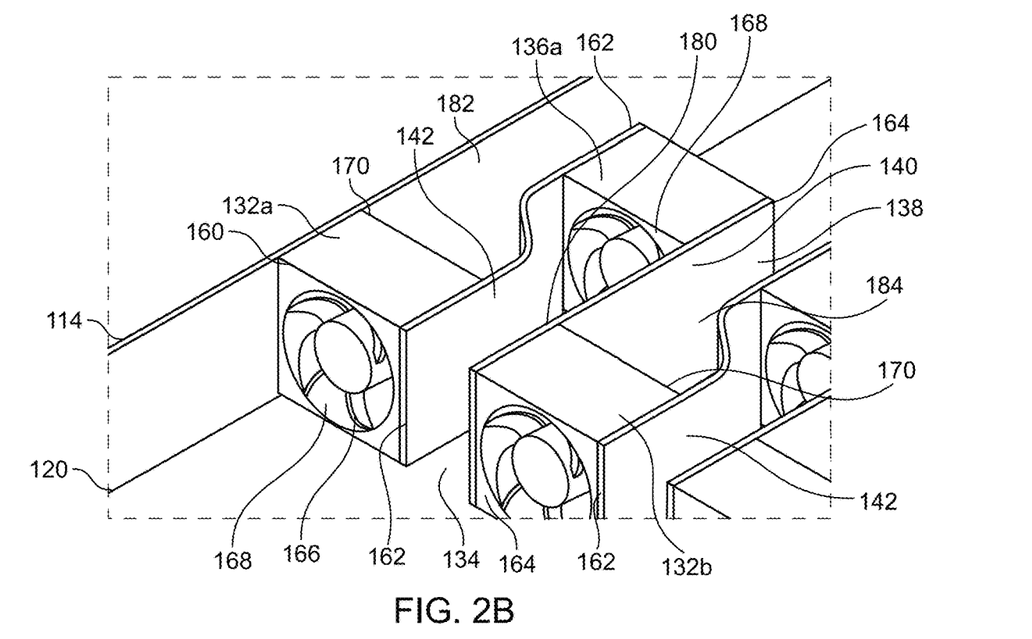
FIG. 2B is a close-up perspective view of fan modules in the staggered arrangement of FIG. 2A.

FIG. 2B is a close-up perspective view of fan modules in the staggered arrangement of FIG. 2A. FIG. 2B shows three channels between the fan modules 132a and 136b defined by the side wall 114, and the panels 142 and 140.

The fan modules 132a, 132b, and 136a shown in FIG. 2B all include a cubic shaped housing 160. The housing 160 includes two side walls 162 and 164 that hold a motor (not shown) and a fan 166. The fan 166 generates airflow from an inlet side 168 to an outlet side 170 by being rotated by the motor. As shown in FIG. 2B, the side wall 164 of the rear fan module 136b is attached to one end of the panel 140. The opposite end of the panel 140 is attached to the side wall 162 of the forward fan module 132b. The panel 142 includes a straight section that is attached to the side wall 162 of the forward fan module 132a. The middle section of the panel 142 is slanted at an angle to connect to another straight section that is attached to the side wall 162 of the rear fan module 136a, as the rear fan module 136a partially overlaps the width of the forward fan module 132a.

An inflow duct or channel 180 is created between the panels 140 and 142 that guides airflow through the gap 134 between the forward fan modules 132a and 132b to the inlet side 168 of the rear fan module 136a. An outflow channel 182 is created between the panel 142 and the side wall 114 that guides airflow from the outlet side 170 of the forward fan module 132a, past the rear fan module 136a through the gap 138. Another outflow duct or channel 184 is created between the panel 140 and another panel 142 attached to the side wall 162 of the fan module 132b that guides airflow from the outlet side 170 of the forward fan module 132b, past the rear fan module 136a.

In the example staggered fan arrangement 130, one, two, or more fan modules may be defined as a fan zone. Each fan zone has fan modules arranged in a staggered arrangement relative to the other fan zones to increase system fan quantity and thus the airflow rate. Thus, the server 100 in FIG. 2A has fan modules in each of eight fan zones created by the four forward fan modules 132a-132d and corresponding outflow channels, and each of the four rear fan modules 136a-136d and corresponding inflow channels. This arrangement increases airflow over the airflow produced by the conventional arrangement 40 of six fan modules 42 side-by-side in a line across the server chassis shown in FIGS. 1A-1B.

Figure 3:
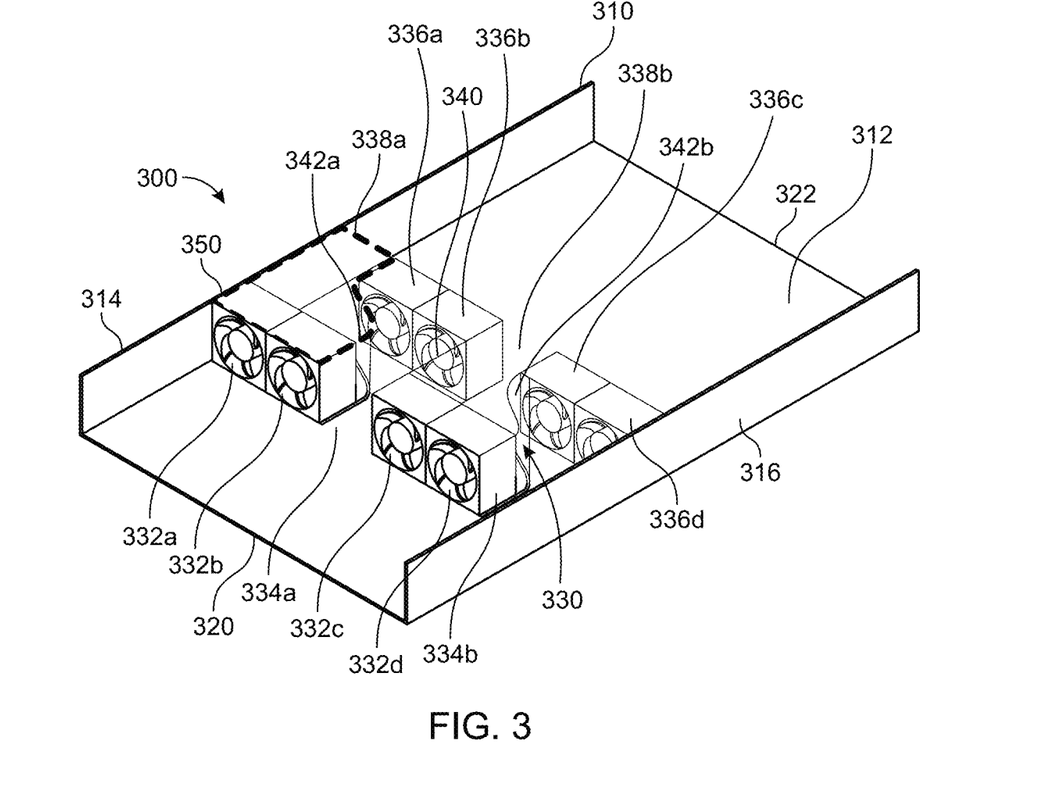
FIG. 3 is a perspective view of an example server chassis with another example staggered fan module arrangement with different fan zones and air duct areas, according to certain aspects of the present disclosure.

FIG. 3 is a perspective view of an example server chassis with another example staggered fan module arrangement with different fan zones and air duct areas than those of the arrangement 130 in FIG. 2A. FIG. 3 shows a server 300 that includes a chassis 310. The chassis 310 holds electronic components (not shown) such as power supplies, circuit boards, processors, memory devices, and interface components on different circuit boards such as a mother board. The chassis 310 includes a bottom panel 312 and two side walls 314 and 316 that define the internal area of the chassis 310. The chassis 310 has a front end 320 and a rear end 322.

An example fan array 330 is positioned between the front end 320 and the rear end 322 to provide airflow to carry away heat generated by the electronic components in the chassis 310. The fan array 330 in this example has a first set of four fan modules 332a-332d arranged in two groups (modules 332a and 332b side-by-side, and modules 332c and 332d side-by-side) in a straight row across the chassis 310 between the side walls 314 and 316. The fan modules 332a and 332b are arranged so there is a gap 334a between the modules 332a and 332b and the modules 332c and 332d. There is also a gap 334b between the module 332d and the wall 316. The first set of fan modules 332a-332d are set a distance from the front end 320. The total length occupied by the fan modules 332a-332d and the gaps 334a-334b is the length occupied by the six fan modules 42 arranged side-by-side in the server chassis 20 shown in FIGS. 1A-1B.

The fan array 330 has a second set of four fan modules 336a-336d arranged in a straight row across the chassis 310 between the side walls 314 and 316. As may be seen, the second set of fan modules 336a-336d are set rearward of the first set of fan modules 332a-332d in a staggered arrangement. Thus, the fan module 336a completely overlaps the width of the forward fan module 332b while the fan module 336b is aligned with the gap 334a between the fan modules 332b and 332c. The fan modules 336a and 336b are arranged next to each other, and the fan modules 336c and 336d are arranged next to each other. A gap 338a having the width of a fan module is defined by the wall 314 and the fan module 336a. The gap 338a is aligned with the width of the forward fan module 332a. Another gap 338b having the width of a fan module is defined between the fan modules 336b and 336c. The gap 338b is aligned with the width of the forward fan module 332c.

A middle straight panel 340 connects the walls of the fan modules 332c and 336b. A panel 342a is connected between one side of the fan module 332b and the opposite side of the fan module 336a. The panel 342a includes an angled middle section to connect to the opposite side of the fan module 336a. A second panel 342b is connected between one side of the fan module 332d and the opposite side of the fan module 336c. The panel 342b includes an angled middle section to connect to the opposite side of the fan module 336c. Thus, the side walls 314 and 316, the middle panel 340, and the panels 342a and 342b define four channels that either direct the airflow to the second set of fan modules 336a-336b or direct airflow from the first set of fan modules 332a-332d.

The fan zones in the fan array 330 include two fan modules each. In this example a fan zone is defined by a dashed line shape 350. The fan zone 350 is defined by the fan modules 332a-332b, the side wall 314 and the panel 342a. The airflow generated from the fan modules 332a-332b is directed by the side wall 314 and the panel 342a that defines a duct or a channel. Similarly, another fan zone may be defined by the fan modules 336a-336b, and the panels 340 and 342a. The panels 340a and 342a thus create another duct or channel to direct air to the fan modules 336a-336b.

Figure 4:
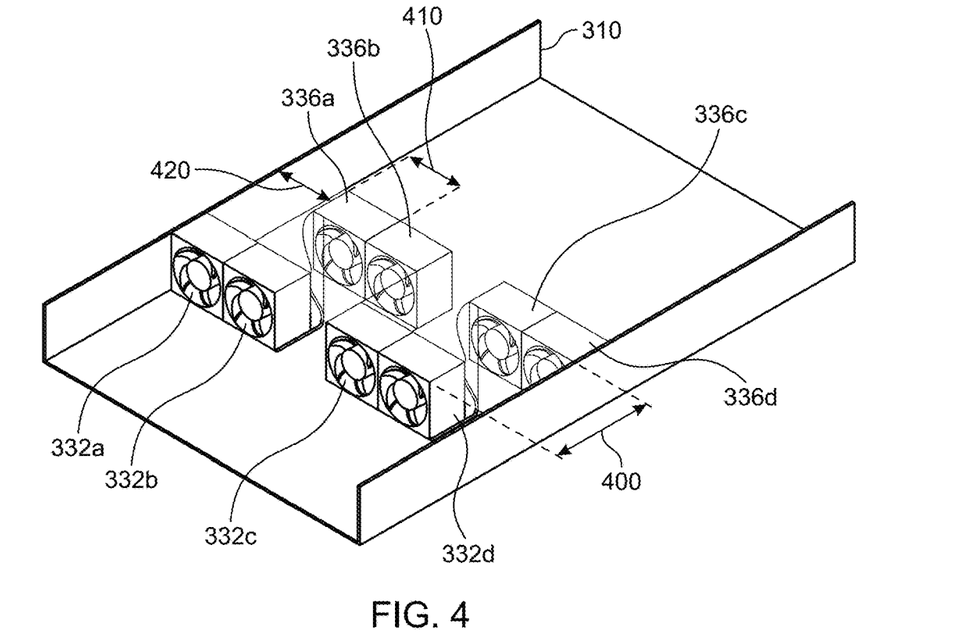
FIG. 4 is a perspective view of the server chassis in FIG. 3 showing design dimensions to optimize the placement of the fans in a staggered arrangement, according to certain aspects of the present disclosure.

The staggered arrangement of fan modules having forward and rear rows of fan modules with gaps between the modules, may be optimized in relation to dimensions for the fan zones. FIG. 4 is a perspective view of the server chassis 310 in FIG. 3 showing design dimensions to optimize the placement of the forward fan modules 332a-332d and rear fan modules 336a-336d in a staggered arrangement. The design dimensions for the arrangement of the front row of fan modules 332a-332d and the rear row of fan modules 336a-336d may be optimized for maximum airflow from the fan array 330 in FIG. 3. A line 400 is a fan stagger pitch dimension. The fan stagger pitch dimension is defined as the distance between the front of the fan modules in the front row and the front of the fan modules in the rear row. In this example, the fan stagger pitch dimension is two times the length of the fan modules. A second line 410 represents the width dimension of one of the fan modules 332a-332d and 336a-336d. A third line 420 represents the duct width dimension, which is the width of the duct or channel either leading to the rear fan modules 336a-336d or coming from the outlets of the front fan modules 332a-332d. Optimizing these dimensions will result in air ducts with streamlined shapes to separate each fan zone and reduce the pressure drop. The fan arrangement size may be optimized based on the air duct inlet/outlet width dimension as represented by the line 420 and the fan stagger pitch dimension as represented by the line 400. In this example, the fan module dimension width length may be represented as the symbol "D" and the other dimensions may be expressed as a multiple of D.

Computational fluid dynamics (CFD) software may be used to simulate airflow from the above fan module arrangements to optimize the dimensions of the array. Such CFD software may be used to simulate the optimal air duct inlet/outlet width length at about 1D, and a fan stagger pitch is at least 2D. These dimensions are in the arrangement of the fan modules 332a-332d and 336a-336d shown in FIG. 3. In this example, the distance between the fan modules 332a-332d and 336a-336d shown in FIG. 3 is 1D, and thus the fan stagger dimension of 2D (the gap and the length of the front fan modules 332a-332d) is optimal. However, other distances between the rows of fan modules more or less than 1D may be used.

Figure 5:
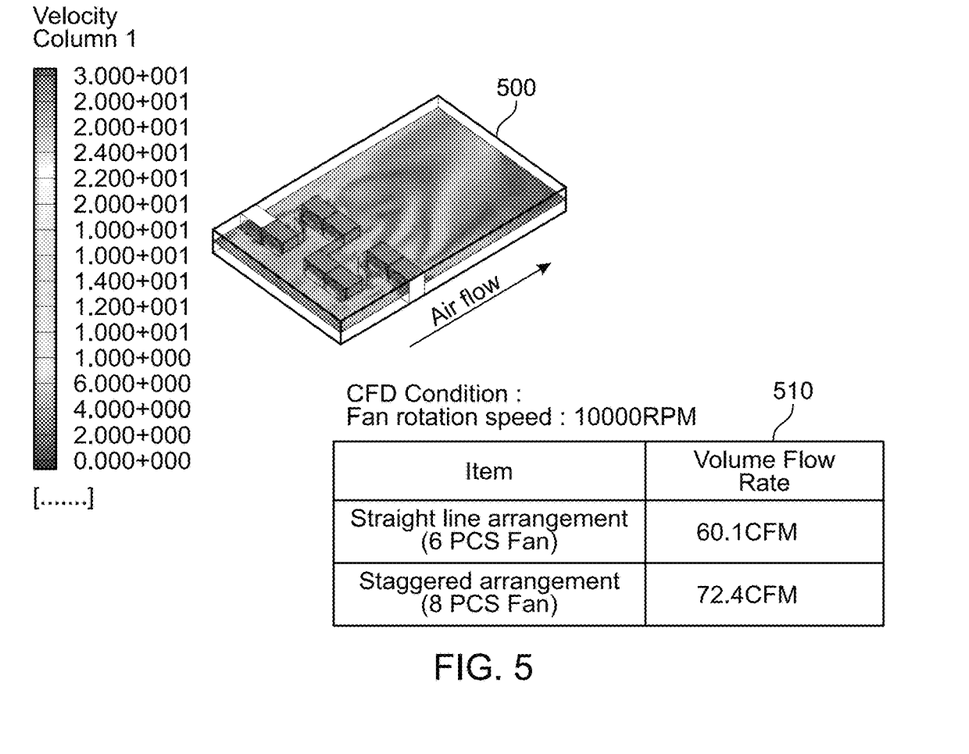
FIG. 5 is a graphic and table of cooling data from the server chassis with staggered fan arrangement based on the identified dimensions in FIG. 4, according to certain aspects of the present disclosure.

FIG. 5 is a graphic and table of cooling data from the server chassis with staggered fan arrangement based on the identified dimensions in FIG. 4. FIG. 5 shows the results of CFD analysis for airflow generated by the fan module arrangement in FIG. 3. FIG. 5 shows a graphic 500 of the flow velocities over the chassis 310 in FIG. 3. FIG. 5 also includes a table 510 that shows the volume flow rate in terms of cubic feet per minute (cfm), assuming a fan rotation speed of 10,000 rpm for the straight line arrangement of six fan modules in FIGS. 1A-1B in comparison with the volume flow rate from the staggered flow rate in FIG. 3. Such analysis shows the best performance results from a staggered arrangement grouping two fans in each fan zone as shown in FIG. 3. The example fan arrangement with zones having two fan modules as shown in FIG. 3 will increase system airflow by 20%, in comparison with the airflow generated by a normal arrangement of six fan modules in FIGS. 1A-1B. This increase is shown in the comparison of system airflow in table 520.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A fan arrangement for an electronic device having a chassis with a length and a width, the chassis including one area having electronic components, the fan arrangement comprising:
   a first row of fan modules located in the chassis relative to the electronic components to generate airflow in a direction of the length of the chassis through the electronic components, the first row of fan modules including at least one gap between the fan modules;
   a second row of fan modules located a predetermined distance from the first row of fan modules, the second row of fan modules including at least one gap between the fan modules, wherein each of the fan modules in the second row of fan modules is staggered from one of the fan modules of the first row of fan modules; and
   a plurality of channels defined by a series of straight panels and slanted panels placed alternatively along a width of the chassis, wherein each straight panel connects one of the fan modules in the first row of fan modules with one of the fan modules in the second row of fan modules and each slanted panel connects another fan module in the first row of fan modules with another fan module in the second row of fan modules.

2. The fan arrangement of claim 1, wherein the plurality of channels is configured to guide airflow generated by the first row of fan modules and the second row of fan modules.

3. The fan arrangement of claim 2, wherein at least one of the fan modules of the second row of fan modules is aligned with the at least one gap between the fan modules of the first row.

4. The fan arrangement of claim 3, wherein the slanted panel includes an angled section.

5. The fan arrangement of claim 1, wherein the at least one gap of the first row of fan modules includes a gap located between each of the fan modules in the first row of fan modules to define multiple gaps, and wherein the at least one gap of the second row of fan modules includes a gap located between said each of the fan modules in the second row of fan modules to define multiple gaps.

6. The fan arrangement of claim 1, wherein the plurality of channels includes a first set of channels that direct air to inlets of the fan modules of the second row.

7. The fan arrangement of claim 1, wherein the plurality of channels includes a second set of channels that direct air from outlets of the fan modules of the first row.

8. A server, the server comprising:
   a chassis having a pair of side walls and a bottom panel;
   electronic components mounted in the bottom panel of the chassis;
   a first row of fan modules located in the chassis relative to the electronic components to generate airflow in a direction of a length of the chassis between the side walls through the electronic components, the first row of fan modules including at least one gap between the fan modules;
   a second row of fan modules located a predetermined distance from the first row of fan modules, the second row of fan modules including at least one gap between the fan modules, wherein each of the fan modules in the second row of fan modules is staggered from one of the fan modules of the first row of fan modules; and
   a plurality of channels defined by a series of straight panels and slanted panels placed alternatively along a width of the chassis, wherein each straight panel connects one of the fan modules in the first row of fan modules with one of the fan modules in the second row of fan modules and each slanted panel connects another fan module in the first row of fan modules with another fan module in the second row of fan modules.

9. The server of claim 8, wherein the plurality of channels is configured to guide airflow generated by the first row of fan modules and the second row of fan modules.

10. The server of claim 9, wherein at least one of the fan modules of the second row of fan modules is aligned with the at least one gap between the fan modules of the first row.

11. The server of claim 10, wherein the slanted panel includes an angled section.

12. The server of claim 8, wherein the at least one gap of the first row of fan modules includes a gap located between each of the fan modules in the first row of fan modules to define multiple gaps, and wherein the at least one gap of the second row of fan modules includes a gap located between said each of the fan modules in the second row of fan modules to define multiple gaps.

13. The server of claim 8, wherein the plurality of channels includes a first set of channels that direct air to inlets of the fan modules of the second row.

14. The server of claim 8, wherein the plurality of channels includes a second set of channels that direct air from outlets of the fan modules of the first row.

15. A server, the server comprising:
   a chassis having a first side wall, a second side wall and a bottom panel attached to the first and second side wall;
   electronic components mounted in the bottom panel of the chassis;
   a first row of fan modules located in the chassis relative to the electronic components, the first row of fan modules having a first group of two fan modules next to each other against the first side wall, and a second group of two fan modules separated from the first group of fan modules by a first gap, the second group of two fan modules separated from the second side wall by a second gap;
   a second row of fan modules located a predetermined distance from the first row of fan modules, the second row of fan modules including a first group of two fan modules staggered from the first group of two fan modules of the first row, wherein one of the two fan modules in the first group of two fan modules in the second row is aligned with the first gap of the first row, a first gap between the first group of two fan modules of the second row and the first side wall, a second group of two fan modules, and a second gap separating the first group of two fan modules of the second row from the second group of two fan modules of the second row;

a center panel connecting the second group of two fan modules of the first row with the first group of two fan modules of the second row; and a first slanted panel connecting the first group of two fan modules of the first row with the first group of two fan modules of the second row, wherein an outflow channel from the first group of two fan modules in the first row is defined between the first slanted panel and the first wall, and an inflow channel to the first group of two fan modules in the second row is defined between the first slanted panel and the center panel.

* * * * *